(12) United States Patent
Hayashida et al.

(10) Patent No.: US 8,766,536 B2
(45) Date of Patent: Jul. 1, 2014

(54) LIGHT-EMITTING MODULE HAVING LIGHT-EMITTING ELEMENTS SEALED WITH SEALING MEMBER AND LUMINAIRE HAVING SAME

(75) Inventors: Yumiko Hayashida, Yokosuka (JP); Soichi Shibusawa, Yokosuka (JP); Yuiko Nakagawa, Yokosuka (JP); Hiroki Tamai, Yokosuka (JP)

(73) Assignee: Toshiba Lighting & Technology Corporation, Yokosuka-shi (JP)

( * ) Notice: Subject to any disclaimer, the term of this patent is extended or adjusted under 35 U.S.C. 154(b) by 0 days.

(21) Appl. No.: 13/591,617

(22) Filed: Aug. 22, 2012

(65) Prior Publication Data

US 2013/0106279 A1    May 2, 2013

(30) Foreign Application Priority Data

Nov. 2, 2011    (JP) ................. 2011-241236

(51) Int. Cl.
*H01J 1/62* (2006.01)
*H01J 63/04* (2006.01)

(52) U.S. Cl.
USPC .......... 313/512; 313/483; 313/510; 313/506; 313/505; 313/503; 313/504

(58) Field of Classification Search
None
See application file for complete search history.

(56) References Cited

U.S. PATENT DOCUMENTS

| | | | |
|---|---|---|---|
| 8,455,910 B2 * | 6/2013 | Chiang et al. | 257/99 |
| 2013/0169144 A1 * | 7/2013 | Chou et al. | 313/498 |

FOREIGN PATENT DOCUMENTS

JP    2011-023138    2/2011

OTHER PUBLICATIONS

English machine translation of JP 2011-023138 (Takashige et al).*

* cited by examiner

*Primary Examiner* — Natalie Walford
(74) *Attorney, Agent, or Firm* — Banner & Witcoff, Ltd.

(57) ABSTRACT

Light-emitting modules according to the embodiments is configured by mounting a plurality of semiconductor light-emitting elements having the same light-emitting property in a closed-up manner on a substrate and sealing the closed up plurality of semiconductor light-emitting elements by a dome shaped sealing member altogether.

18 Claims, 11 Drawing Sheets

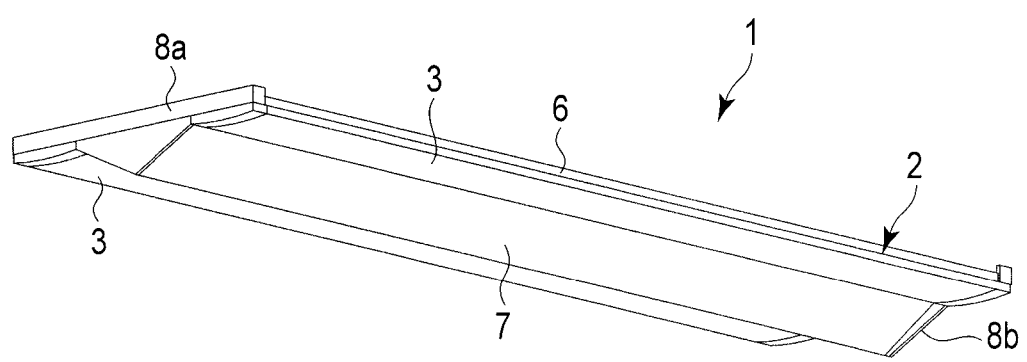
F I G. 1

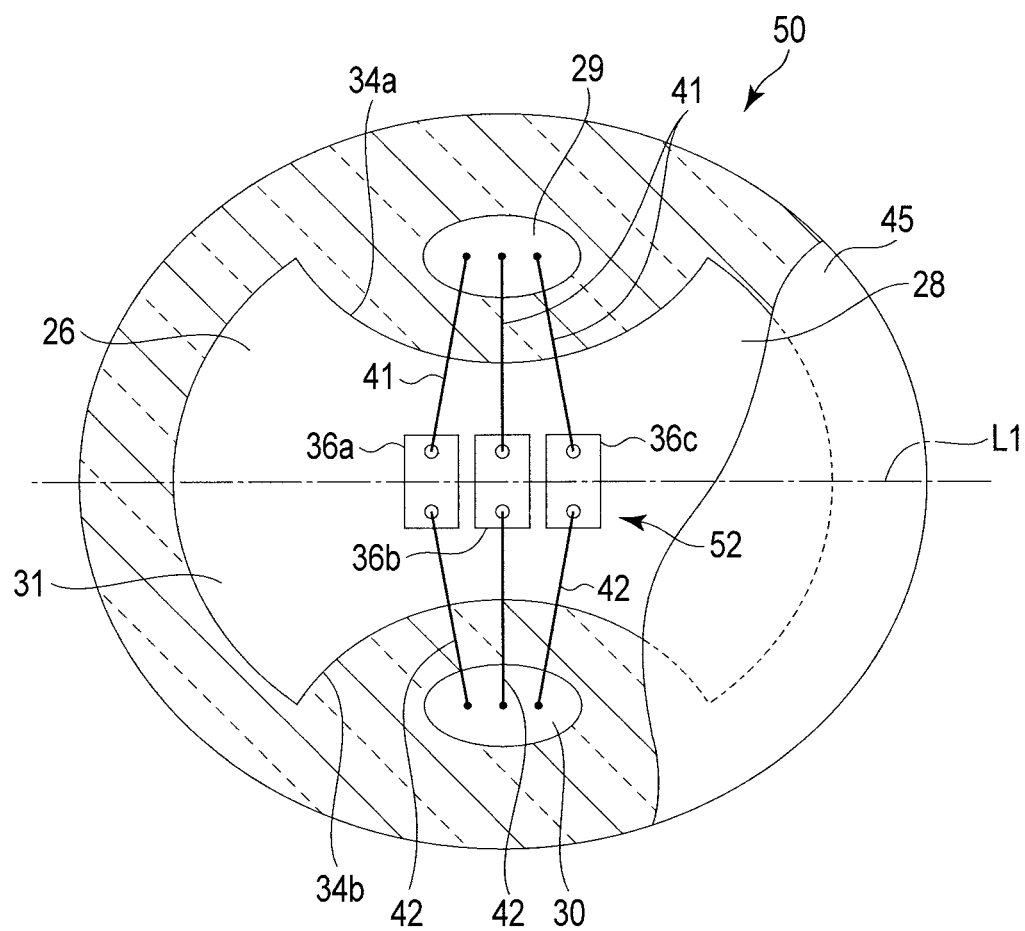
F I G. 10

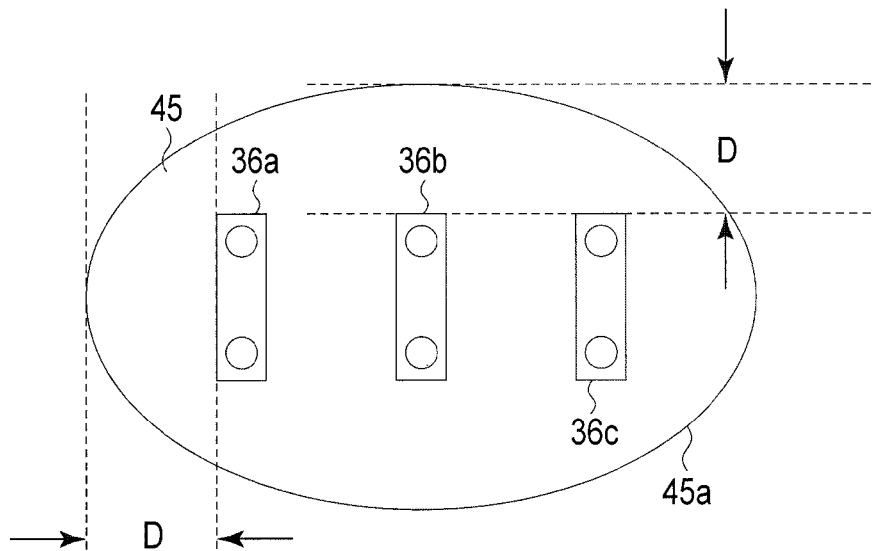
F I G. 12A
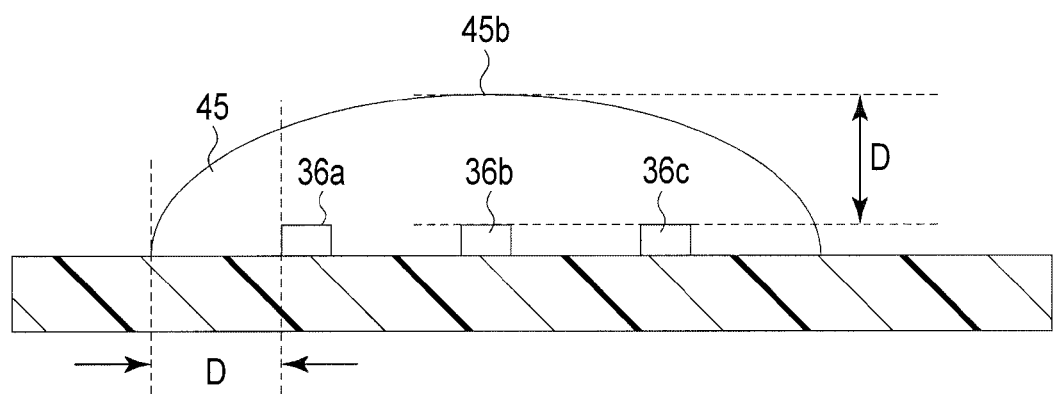
F I G. 12B

US 8,766,536 B2

LIGHT-EMITTING MODULE HAVING LIGHT-EMITTING ELEMENTS SEALED WITH SEALING MEMBER AND LUMINAIRE HAVING SAME

CROSS-REFERENCE TO RELATED APPLICATIONS

This application is based upon and claims the benefit of priority from Japanese Patent Application No. 2011-241236, filed Nov. 2, 2011, the entire contents of which are incorporated herein by reference.

FIELD

Embodiments described herein relate generally to a light-emitting module having a plurality of semiconductor light-emitting elements such as LED (light-emitting diode) mounted on a substrate and sealed with a sealing member, and a luminaire provided with the light-emitting module.

BACKGROUND

In the related art, a luminaire provided with a chip-on-board (COB) type light-emitting module having a plurality of LED chips mounted on a substrate is known as a luminaire using LEDs. The LED chips respectively have light-emitting colors depending on the type. Therefore, for example, the LED chip emitting blue light is sealed by a sealing member containing yellow phosphor excited by blue light and emitting yellow light which is a complementary color with respect to blue. Accordingly, a luminaire emitting white light mixed with blue light and yellow light is provided.

In the case of a relatively small bulb, a plurality of LED chips are surrounded by a frame and sealed with a sealing member altogether. However, in the case of a relatively large base light, the respective LED chips mounted on a relatively long and wide substrate are sealed individually. In this case, for example, a material of the sealing member having a high thixotropy is dropped on the respective LED chips using a dispenser and is applied into a shape swelled from the substrate like a dome.

However, in the light-emitting module of the type which seals the plurality of LED chips altogether, since the frame is filled with a relatively large amount of the material of sealing member, material cost is increased in order to obtain a large light-emitting surface area. Also, in the light-emitting module of the type which seals the LED chips individually, a sufficiently satisfactory luminous flux can hardly be obtained.

Therefore, development of a light-emitting module in which a light-emitting surface area can be increased, a sufficiently satisfactory luminous flux is obtained, and energy efficiency can be enhanced, and a luminaire having such a light-emitting module is desired.

BRIEF DESCRIPTION OF THE DRAWINGS

FIG. 1 illustrates a perspective view of a luminaire provided with a light-emitting module according to a first embodiment;

FIG. 10 illustrates a plan view of a principal portion of the light-emitting module according to a second embodiment;

FIG. 12A illustrates a plan view for explaining a method of optimizing a shape of a sealing member of the light-emitting module in FIG. 10; and FIG. 12B is a cross-sectional view of FIG. 12A.

DETAILED DESCRIPTION

A light-emitting module according to an embodiment is configured by mounting a plurality of semiconductor light-emitting elements having the same light-emitting property on a substrate in a closed-up manner, and the plurality of closed-up semiconductor light-emitting elements are sealed altogether with a sealing member having a dome shape.

Various Embodiments will be described hereinafter with reference to the accompanying drawings.

(First Embodiment)

Referring now to FIG. 1 to FIG. 7, a first embodiment will be described.

Figure 2:
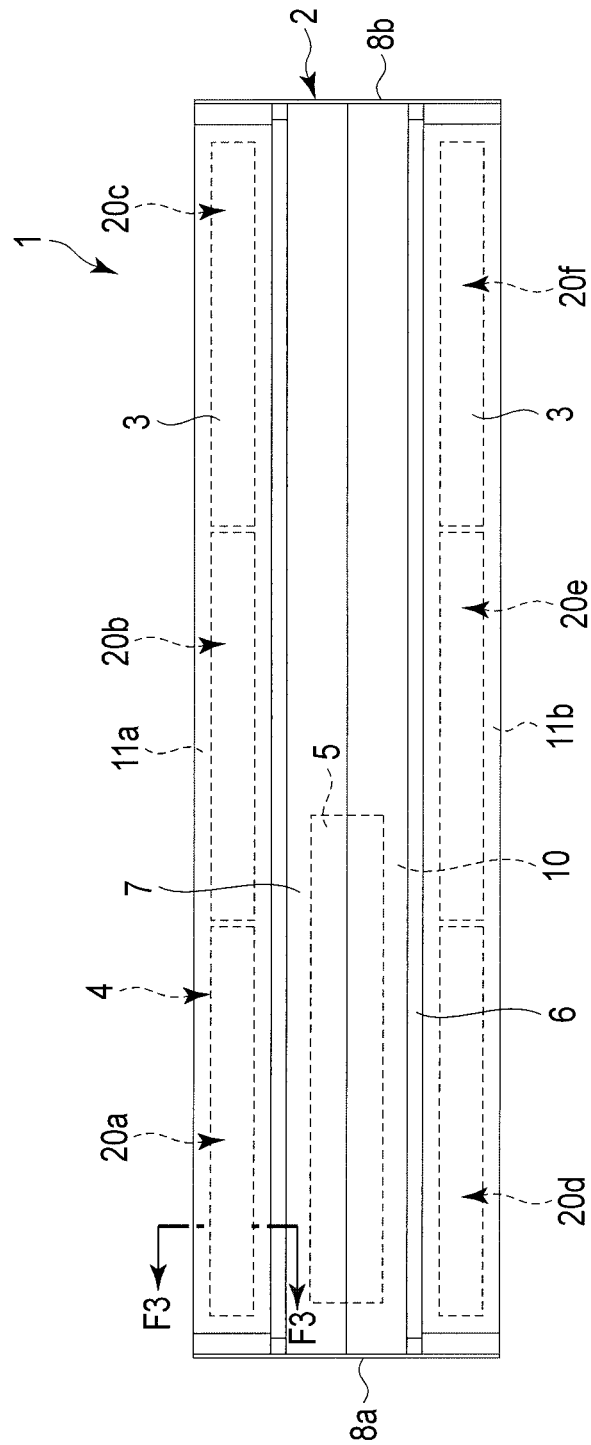
FIG. 2 illustrates a plan view of the luminaire viewed from a side where light goes out.
Figure 3:
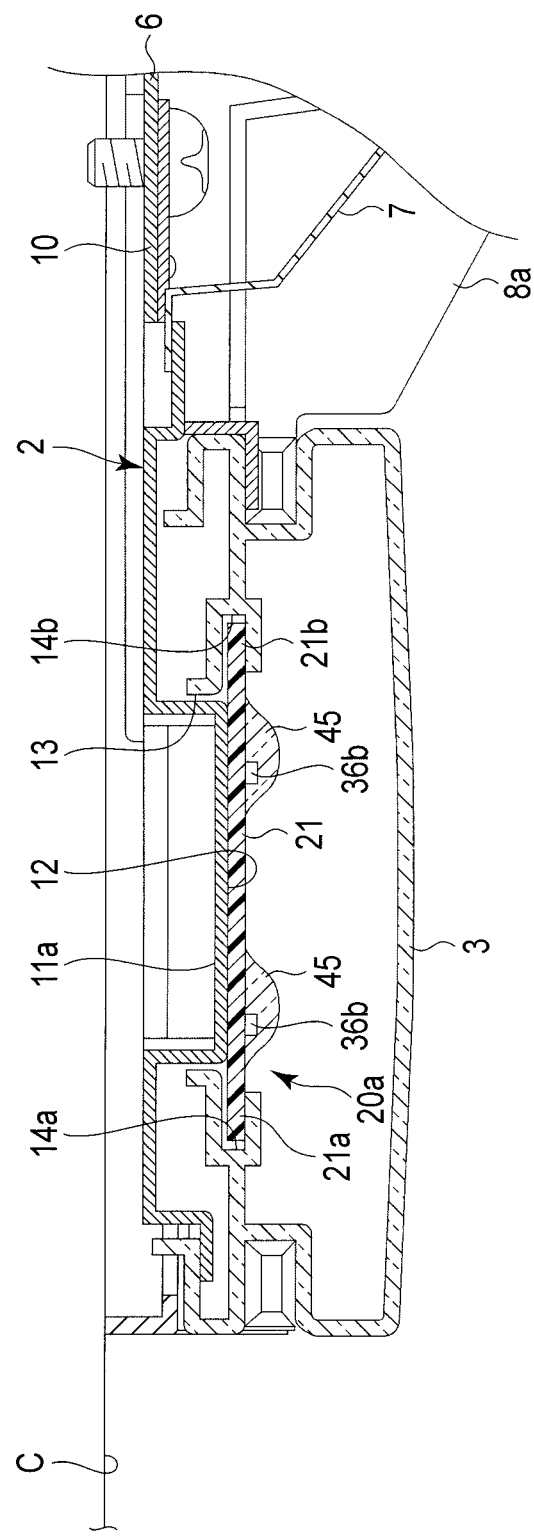
FIG. 3 illustrates a cross-sectional view taken along line F3-F3 in FIG. 2.

FIG. 1 to FIG. 3 illustrate a base light 1 for general lighting. The base light 1 is an example of a luminaire used, for example, indoors, surface mounted to a ceiling surface C of a building.

The base light 1 is provided with an apparatus body 2, a pair of shades 3, a light source 4, and a lighting circuit 5. The apparatus body 2 has a chassis 6, a center cover 7, a first side cover 8a, and a second side cover 8b.

The chassis 6 is formed of a plate material such as galvanized steel plate and has an elongated shape extending along the ceiling surface C. The chassis 6 includes a fixing portion 10, and a pair of light source supporting portions 11a and 11b.

The fixing portion 10 has a substantially flat plate shape and is fixed, for example, to an element which constitutes a ceiling of a building with a plurality of screws. The light source supporting portions 11a and 11b are arranged in parallel to each other having the fixing portion 10 therebetween. The light source supporting portions 11a and 11b each have a flat supporting surface 12. The supporting surface 12 protrudes downward with respect to the fixing portion 10, and extends straight in the longitudinal direction of the chassis 6.

The center cover 7 is mounted to the fixing portion 10 of the chassis 6. The center cover 7 projects into a V-shape downward of the chassis 6 from between the light source supporting portions 11a and 11b.

The first side cover 8a covers one end along the longitudinal direction of the chassis 6 and one end along the longitudinal direction of the center cover 7 continuously. The second side cover 8b covers the other end along the longitudinal direction of the chassis 6 and the other end along the longitudinal direction of the center cover 7 continuously.

The shades 3 are formed of translucent resin material such as acryl resin or polycarbonate resin. The shades 3 extend straight in the longitudinal direction of the chassis 6.

As illustrated in FIG. 3, the shades 3 have an opening 13 opening toward the light source supporting portions 11a and 11b of the chassis 6. The opening 13 has a slit-shape extending in the longitudinal direction of the chassis 6. A pair of holding grooves 14a and 14b are formed at edges of the opening 13. The holding grooves 14a and 14b extend along the entire length of the shades 3. Opening ends of the holding grooves 14a and 14b face each other at a distance from each other in the width direction of the chassis 6.

In addition, the shades 3 are mounted on the chassis 6 via a plurality of brackets. When the shades 3 are mounted on the chassis 6, the light source supporting portions 11a and 11b of the chassis 6 are covered by the shades 3 from below.

As illustrated in FIG. 2, the light source 4 includes a first to sixth light-emitting modules 20a, 20b, 20c, 20d, 20e and 20f. The first to sixth light-emitting modules 20a, 20b, 20c, 20d, 20e and 20f have an elongated shape extending in the longitudinal direction of the light source supporting portions 11a and 11b.

According to the first embodiment, the first to third light-emitting modules 20a, 20b and 20c are held by the holding grooves 14a and 14b of one of the shades 3, and are arranged in a line so as to extend along the longitudinal direction of the light source supporting portion 11a. In the same manner, the fourth to sixth light-emitting modules 20d, 20e and 20f are held by the holding grooves 14a and 14b of the other one of the shades 3, and are arranged in a line so as to extend along the longitudinal direction of the light source supporting portion 11b.

Therefore, the first to sixth light-emitting modules 20a, 20b, 20c, 20d, 20e and 20f are integrated with the shades 3 and are covered with the shades 3. In addition, the first to sixth light-emitting modules 20a, 20b, 20c, 20d, 20e and 20f are electrically connected in series.

The lighting circuit 5 is configured to control lighting of the first to sixth light-emitting modules 20a, 20b, 20c, 20d, 20e and 20f, and converts AC current output from an AC power source into a DC current and supplies the same to the first to sixth light-emitting modules 20a, 20b, 20c, 20d, 20e and 20f. The lighting circuit 5 is supported by the fixing portion 10 of the chassis 6 and is covered with the center cover 7.

The first to sixth light-emitting modules 20a, 20b, 20c, 20d, 20e and 20f have basically a common structure. Therefore, the first light-emitting module 20a is described as a representative example.

Figure 4:
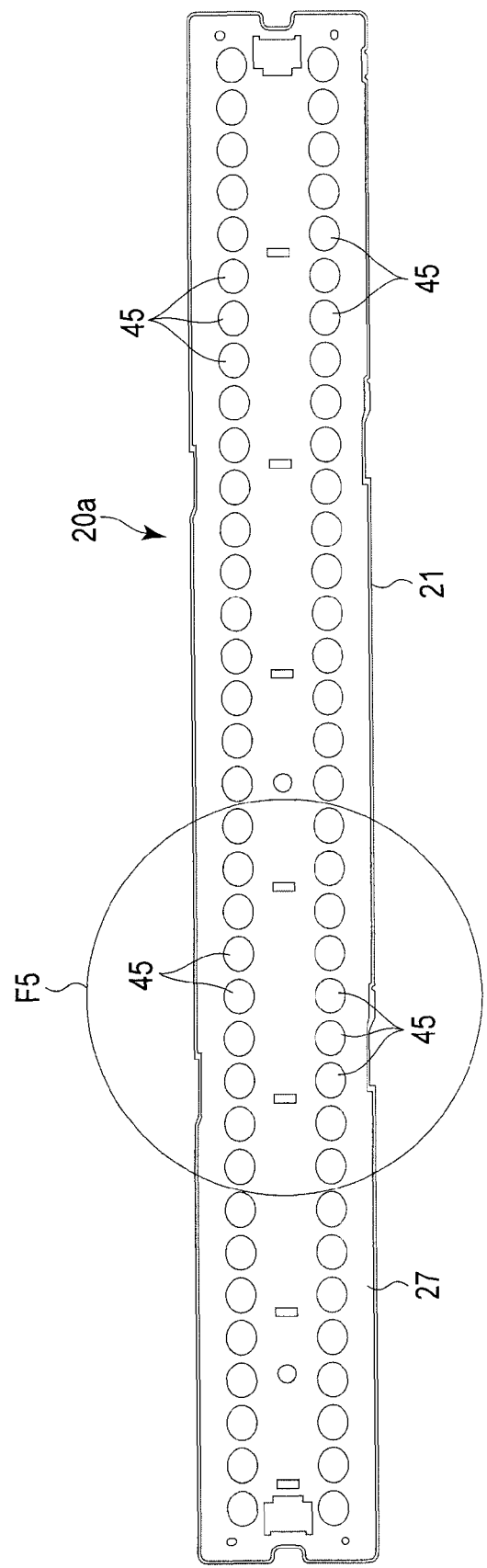
FIG. 4 illustrates a plan view of the light-emitting module integrated in the luminaire in FIG. 1 viewed from a side where light goes out.
Figure 5:
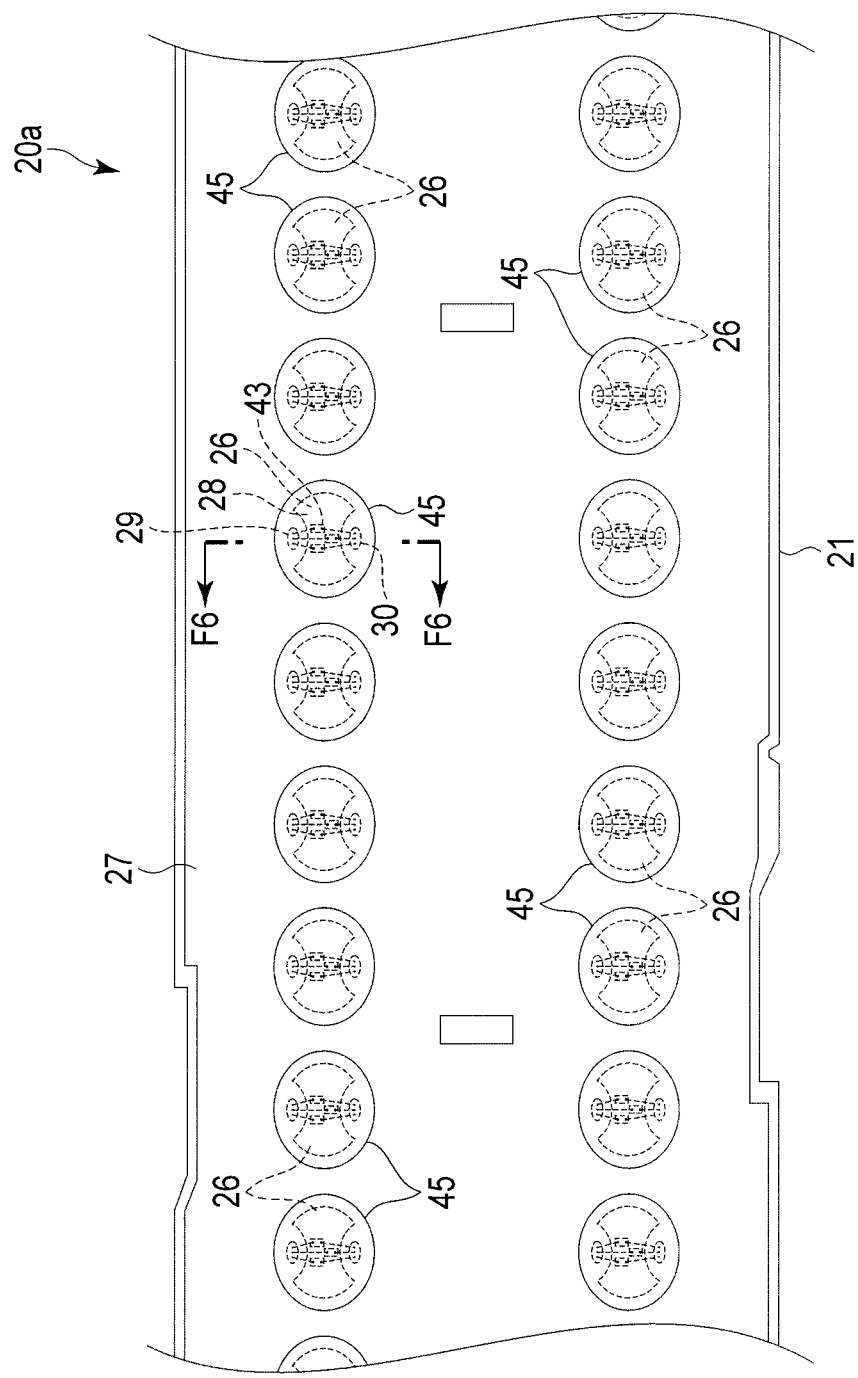
FIG. 5 illustrates a partly enlarged plan view of an area F5 in FIG. 4 in an enlarged scale.
Figure 6:
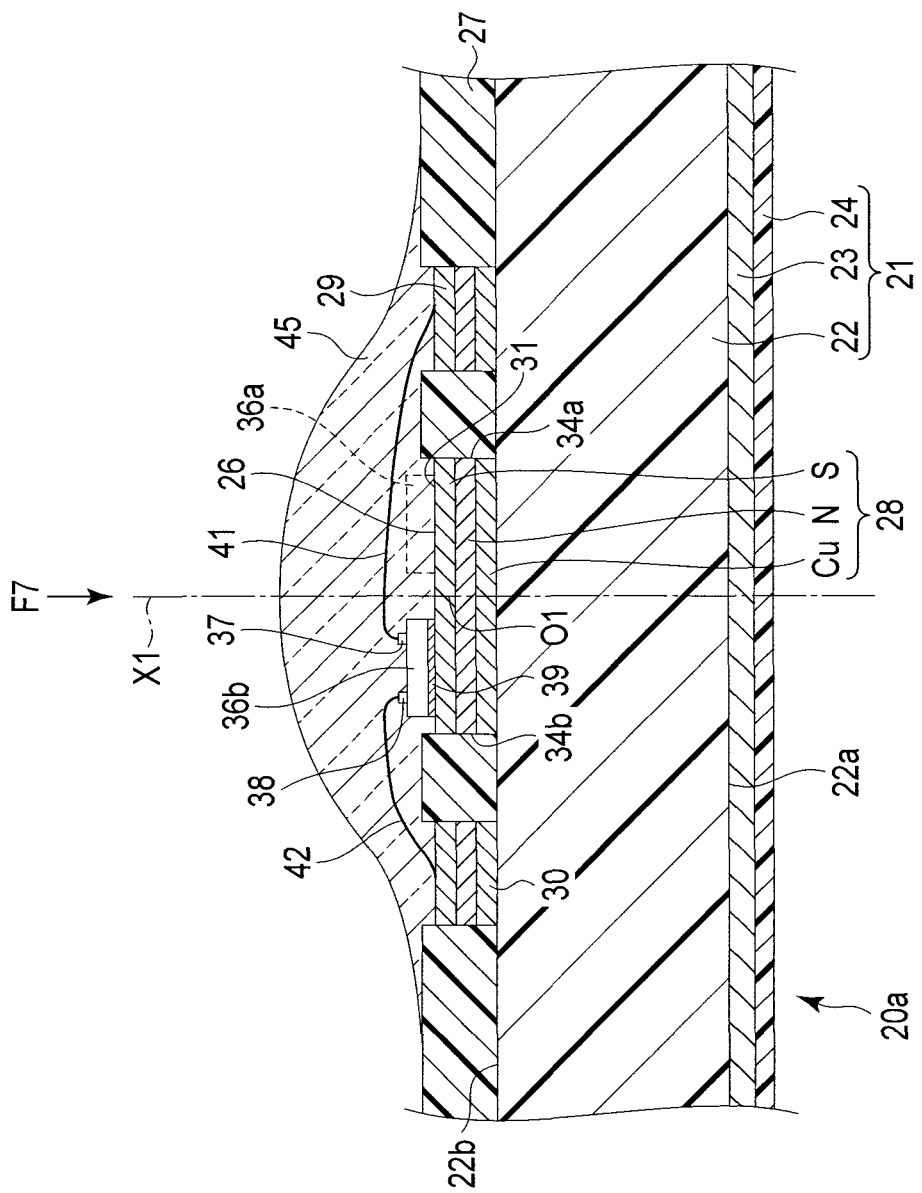
FIG. 6 illustrates a cross-sectional view taken along line F6-F6 in FIG. 5.

As illustrated in FIG. 4 to FIG. 6, the first light-emitting module 20a includes a substrate 21. The substrate 21 has a three-layer structure having a base 22, a metallic layer 23, and a resist layer 24. The thickest base 22 is formed of a synthetic resin such as epoxy resin or glass composite substrate, and has an elongated shape extending in the longitudinal direction of the chassis 6.

The metallic layer 23 is formed of, for example, copper foil, and is laminated on a back surface 22a of the base 22. The resist layer 24 is formed of an insulating material such as synthetic resin, for example. The resist layer 24 is laminated continuously on the metallic layer 23 and an outer peripheral portion of the back surface 22a of the base 22. The metallic layer 23 and the resist layer 24 reinforce the substrate 21 in cooperation with each other in order to prevent warping of the substrate 21.

The substrate 21 includes a pair of side edges 21a and 21b extending in the longitudinal direction as illustrated in FIG. 3. The side edges 21a and 21b of the substrate 21 are inserted into the holding grooves 14a and 14b of the shade 3 from one end along the longitudinal direction of the shade 3. As a result of the insertion, the substrate 21 is held by the shade 3, and the resist layer 24 of the substrate 21 comes into contact with the supporting surface 12 of the light source supporting portion 11a.

Figure 7:
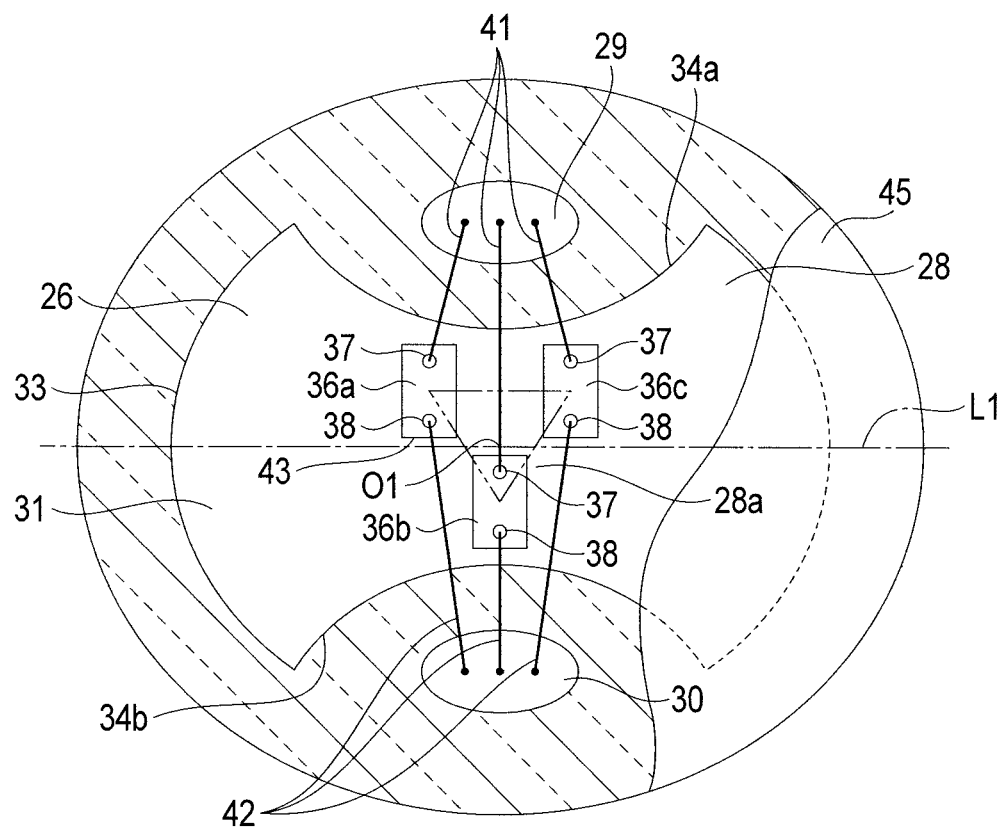
FIG. 7 illustrates a plan view of a configuration in FIG. 6 when viewed in a direction of an arrow F7.

As illustrated in FIG. 5 to FIG. 7, a plurality of conductive patterns 26 and an insulating layer 27 are laminated on a front surface 22b (mounting surface) of the base 22. The conductive patterns 26 are arranged in two rows at a distance in the width direction of the substrate 21, and are apart from each other in the longitudinal direction of the substrate 21 in each row.

The conductive patterns 26 each include a mounting pad 28, a first power distribution pad 29, and a second power distribution pad 30. The mounting pad 28 employs a three-layer structure including, for example, first to third metallic layers Cu, N, S laminated one on top of another.

Specifically, the first metallic layer Cu is formed by applying etching on copper foil laminated on the front surface 22b of the base 22. The second metallic layer N is laminated on the first metallic layer Cu. The second metallic layer N is formed by applying nickel plating on the first metallic layer Cu. The third metallic layer S is laminated on the second metallic layer N. The third metallic layer S is formed by applying silver plating on the second metallic layer N. The third metallic layer S forms a surface layer of the mounting pad 28.

Therefore, a surface of the mounting pad 28 corresponds to a silver light-reflecting surface 31. The total beam reflectance of the light-reflecting surface 31 is preferably, for example, at least 90%. The mounting pad 28 functions as a light-reflecting layer.

As illustrated in FIG. 7, the mounting pad 28 in this embodiment has a substantially oval shape and has a longitudinal axis L1 extending in the direction in which the conductive patterns 26 are arranged. The mounting pad 28 includes an outer peripheral edge 33 curved into an arc shape and a pair of depressed portions 34a and 34b. The depressed portions 34a and 34b each have a shape formed by notching the outer peripheral edge 33 of the mounting pad 28 in an arcuate shape toward a center O1 of the mounting pad 28 where the longitudinal axis L1 passes, and are arranged along the direction orthogonal to the longitudinal axis L1 of the mounting pad 28.

In other words, the depressed portions 34a and 34b face each other having the center O1 of the mounting pad 28 therebetween. Therefore, the mounting pad 28 has a form narrowed at a central portion 28a including the center O1.

The first and second power distribution pads 29 and 30 have an oval shape significantly smaller than the mounting pad 28, and have the same size. The first and second power distribution pads 29 and 30 have a three-layer structure having the first to third metallic layers Cu, N, S in the same manner as the mounting pad 28, and the surface layers thereof are formed of silver.

The first and second power distribution pads 29 and 30 are formed on the front surface 22b of the base 22 so as to be accommodated in the depressed portions 34a and 34b of the mounting pad 28. In other words, the first and second power distribution pads 29 and 30 are distributed in the direction orthogonal to the longitudinal axis L1 of the mounting pad 28 with respect to the center O1 of the mounting pad 28, and are arranged symmetrically with each other with respect to the longitudinal axis L1.

In addition, the first and second power distribution pads 29 and 30 are apart from the depressed portions 34a and 34b of the mounting pad 28, and are kept in a state of being electrically insulated from the mounting pad 28. In other words, the depressed portions 34a and 34b of the mounting pad 28 are notched so as to avoid the first and second power distribution pads 29 and 30.

As illustrated in FIG. 6, the insulating layer 27 is laminated on the front surface 22b of the base 22. The insulating layer 27 covers an area of the front surface 22b of the base 22 other than the mounting pad 28, the first power distribution pad 29, and the second power distribution pad 30. Therefore, each of the surface layer of the mounting pad 28, a surface layer of the first power distribution pad 29, and a surface layer of the second power distribution pad 30 is not covered with the insulating layer 27 and are exposed out from the substrate 21.

Part of the insulating layer 27 is filled in the depressed portions 34a and 34b of the mounting pad 28, and is interposed between the mounting pad 28 and the first power distribution pad 29, and between the mounting pad 28 and the second power distribution pad 30. In addition, the insulating layer 27 protrudes in the thickness direction of the substrate 21 with respect to the surface layer of the mounting pad 28, the surface layer of the first power distribution pad 29, and the surface layer of the second power distribution pad 30.

According to the first embodiment, the insulating layer 27 is formed of, for example, a white resin material having an electrical insulating property. Therefore, the insulating layer 27 also has a function as the light reflecting layer.

As illustrated in FIG. 7, first to third light-emitting diodes (LED) 36a, 36b, and 36c (hereinafter, referred to as LED chips 36a, 36b and 36c) are mounted on the light-reflecting surface 31 of the mounting pad 28. The LED chips 36a, 36b and 36c are respectively an example of the semiconductor light-emitting elements formed of common bear chips configured to emit blue light, for example. The LED chips 36a, 36b and 36c have a rectangular shape in plan view and, for example, the length of the long side is 600 to 650 μm and the length of the short side is 200 to 250 μm.

Furthermore, the LED chips 36a, 36b and 36c each have a first electrode 37 as an anode and a second electrode 38 as a cathode. The first and second electrodes 37 and 38 are arranged at a distance in the longitudinal direction on each surface of the LED chips 36a, 36b and 36c on the side farther from the substrate 21.

The LED chips 36a, 36b and 36c are respectively bonded to the light-reflecting surface 31 using a die-bonding material 39 having translucency. According to the first embodiment, the LED chips 36a, 36b and 36c are arranged at a distance in the direction of the longitudinal axis L1 of the mounting pad 28 at the central portion 28a of the mounting pad 28 and are arranged in a zigzag pattern with respect to the longitudinal axis L1.

Specifically, the first light-emitting diode 36a and the third light-emitting diode 36c are shifted toward the first power distribution pad 29 with respect to the longitudinal axis L1. The second light-emitting diode 36b is shifted toward the second power distribution pad 30 with respect to the longitudinal axis L1.

Therefore, as illustrated by a double dashed chain line in FIG. 7, the LED chips 36a, 36b and 36c are arranged in a ring shape at a position just corresponding to three corners of a regular triangle and closed up so as to surround the center O1 of the mounting pad 28 at the central portion 28a of the mounting pad 28. More specifically, the centers of the respective LED chips 36a, 36b and 36c are arranged in a layout positioned at the corners of the regular triangle.

The first electrodes 37 of the LED chips 36a, 36b and 36c are each electrically connected to the first power distribution pad 29 via a first bonding wire 41 individually. In the same manner, the second electrodes 38 of the LED chips 36a, 36b and 36c are each electrically connected to the second power distribution pad 30 via a second bonding wire 42 individually.

Consequently, the LED chips 36a, 36b and 36c bonded respectively to the mounting pad 28 constitute a diode group 43 connected in parallel to each other. The diode groups 43 on the mounting pad 28 are connected in series along the direction of arrangement of the conductive patterns 26 and constitute two rows of diode rows corresponding to the conductive patterns 26 on the substrate 21.

Furthermore, according to the first embodiment, the diode groups 43 are grounded via the chassis 6 of the apparatus body 2.

As illustrated in FIG. 4 to FIG. 7, a plurality of sealing members 45 are formed on the substrate 21. The sealing members 45 are arranged in two rows at a distance in the width direction of the substrate 21 so as to correspond to the conductive patterns 26, and are apart from each other in the longitudinal direction of the substrate 21 in each row.

The sealing members 45 seal the diode groups 43 bonded to the mounting pad 28 and the first and second bonding wires 41 and 42 corresponding to the diode groups 43 on the substrate 21. The sealing members 45 consist primarily of a resin, and include a predetermined amount of phosphor particles and a predetermined amount of filler mixed in the resin.

As a resin contained in the sealing member 45, a resin-based silicone resin or a hybrid-based silicone resin having translucency are preferably used, for example. The resin-based silicon resin and the hybrid-based silicone resin have a three-dimensionally bridged structure, and hence are harder than translucent silicone rubber.

In addition, the resin-based silicone resin provides lower performance to allow gas such as oxygen or moisture vapor than silicone oil or silicone rubber. In the case of the first embodiment, oxygen transmittance of the sealing members 45 is 1200 cm$^3$ (m$^2$·day·atm) or lower and moisture transmittance is 35 g/m$^2$ or lower.

By selecting the resin of this type, degrading of the mounting pad 28 caused by transmittance of the gas in the atmosphere through the sealing members 45 is prevented and the light-reflecting property of the light-reflecting surface 31 is desirably maintained.

The phosphor particles contained in the sealing member 45 have a diameter D of 1 μm or larger, and are dispersed in the resin substantially uniformly. As the phosphor particles, yellow phosphor particles which are excited by the blue light emitted by the LED chips and emit yellow light are used. The yellow is a complementary color with respect to blue, and presents white color by being mixed with blue.

However, the phosphor particles to be mixed with the sealing members 45 are not limited to the yellow phosphor particles. For example, in order to improve color rendering properties of the light emitted from the LED chips, red phosphor particles exited by blue light and emitting red light, or green phosphor particles emitting green light may be added to the resin.

The sealing member 45 is swelled from the insulating layer 27 of the substrate 21 so as to integrally enclose the mounting pad 28, the first and second power distribution pads 29 and 30 corresponding to the mounting pad 28, the diode group 43 on the mounting pad 28, and the first and second bonding wires 41 and 42 extending across the diode group 43 and the first and second power distribution pads 29 and 30.

The sealing member 45 is formed by dropping the resin in a liquid state before being hardened toward the mounting pad 28. When dropping the material of the sealing member 45, a dispenser is preferably used. The material of the sealing member 45 dropped toward the mounting pad 28 is hardened into a dome shape by being heated at a temperature of, for example, 150° C. for 60 minutes.

According to the sealing member 45 in the first embodiment, the resin as the principal component thereof has physicality which maintains a predetermined shape even in a state of not being hardened immediately after the resin is dropped toward the mounting pad 28. The physicality of the resin here means thixotropy or viscosity.

In other words, as illustrated in FIG. 6, the sealing member 45 is configured to maintain the dome shape so as to continuously cover the mounting pad 28, the first and second power distribution pads 29 and 30, the diode group 43 and the first and second bonding wires 41 and 42 even in a state of not hardened immediately after the resin is dropped on the mounting pad 28.

As illustrated in FIG. 5 and FIG. 7 in plan view, the dome shaped sealing members 45 have a substantially oval shape having commonly the longitudinal axis L1 of the mounting pads 28 and are arranged in the longitudinal direction of the substrate 21 at a distance. The shape of the sealing member 45 is not limited to the oval shape and may be a circular shape etc.

With the base light 1 configured as described above, when a power switch of the base light 1 is turned ON, a DC voltage is applied from the lighting circuit 5 to the conductive patterns 26 of the first to sixth light-emitting modules 20*a*, 20*b*, 20*c*, 20*d*, 20*e* and 20*f*. Accordingly, the diode groups 43 mounted on the plurality of mounting pads 28 emit light altogether.

Blue light emitted from the bear chips of the diode groups 43 enters the sealing members 45. Part of the blue light entering the sealing members 45 is absorbed by the phosphor particles. The remaining part of the blue light passes through the sealing members 45 without being absorbed by the phosphor particles.

The phosphor particles which absorbed the blue light are excited and emit yellow light which is a complementary color. The yellow light passes through the sealing members 45. Therefore, the yellow light and the blue light are mixed to each other in the interior of the sealing members 45 and generate white light. The white light passes through the sealing members 45 and the shades 3 and is radiated out of the base light 1, and is provided to light the room from the ceiling surface C.

In the first embodiment, the case where the LED chips emitting blue light has been described. However, for example, LED chips emitting ultraviolet rays may be employed. In this case, in order to cause the diode groups 43 to emit white light, phosphor which absorbs the ultraviolet rays and excites and emits light having peaks of three wavelengths including blue, red, and green may be mixed into the sealing members 45.

Furthermore, according to the first embodiment, the mounting pad 28 has the depressed portions 34*a* and 34*b* notched into an arc shape toward the center O1 of the mounting pad 28, and hence has a shape narrowed at the central portion 28*a* of the mounting pad 28. In contrast, the first and second power distribution pads 29 and 30 to which the first and second bonding wires 41 and 42 are connected have a significantly smaller shape than the mounting pad 28, and the surface areas of the first and second power distribution pads 29 and 30 may be reduced.

In this configuration, the surface areas of the first and second power distribution pads 29 and 30 may be minimized while increasing the surface areas of the mounting pads 28 each having the light-reflecting surface 31 on the surface thereof, and excessive electrical charge is prevented from accumulating between grounding portions of the first to sixth light-emitting modules 20*a*, 20*b*, 20*c*, 20*d*, 20*e* and 20*f* and the first and second power distribution pads 29 and 30.

Consequently, when the power switch of the base light 1 is turned OFF and the first to sixth light-emitting modules 20*a*, 20*b*, 20*c*, 20*d*, 20*e* and 20*f* are extinguished, minute current caused by floating capacitance can hardly flow to the diode groups 43 of the first to sixth light-emitting modules 20*a*, 20*b*, 20*c*, 20*d*, 20*e* and 20*f*.

Therefore, dark lightening of the base light 1 which the diode groups 43 emit light weakly can be eliminated almost perfectly.

In particular, according to the first embodiment, as illustrated in FIG. 7, since the surface areas of the first and second power distribution pads 29 and 30 are minimized, the bonding wires 41 and 42 are wired so as to converge on the respective power distribution pads 29 and 30. Accordingly, the bonding wires 41 and 42 may be shortened, and hence the termination of the lifetime due to disconnection of the wiring caused by thermal stress is postponed.

As described above, according to the first embodiment, the plurality of (three in the first embodiment) LED chips 36*a*, 36*b* and 36*c* are mounted on the substrate 21 in a closed-up manner, and the plurality of LED chips 36*a*, 36*b* and 36*c* are sealed in the dome-shaped sealing member 45 together. Therefore, provision of a bank (frame) for pouring the resin material of the sealing members is not necessary, and the manufacturing cost of the light-emitting module 20*a* may be reduced correspondingly. Also, since the bank is not provided, the light emitted from the plurality of LED chips 36*a*, 36*b* and 36*c* is not blocked by the bank, and hence the light-emitting module 20*a* having a desirable appearance is provided.

According to the first embodiment, the plurality of LED chips 36*a*, 36*b* and 36*c* are sealed by one sealing member 45, light-emission intensity as the diode groups 43 may be enhanced, the luminous flux of the light-emitting module 20*a* may be increased, and the light-emission intensity of the base light 1 may be enhanced. In other words, in comparison with the luminaire of the related art in which one LED chip is sealed by one sealing member, the luminous flux emitted from the diode groups 43 may be increased to substantially three times, and the light-emission intensity may be enhanced correspondingly. Consequently, the number of light-emitting modules 20*a* may be reduced and, in addition, the number of base lights 1 (luminaires) may also be reduced, so that energy saving is achieved.

Since the plurality of LED chips 36*a*, 36*b* and 36*c* are sealed by one sealing member 45, the light-emitting efficiency of the light-emitting module 20*a* may be enhanced. For example, a light emitting element, configured to emit light of 100 lm when a current of 100 mA is passed through a single LED chip, has a feature such that the rate of the current converted to heat at the time of light emission is reduced when a current of 50 mA, which is a half, is passed therethrough. Therefore, for example, the light-emitting element emits light of 55 lm, which exceeds 50 lm. Therefore, when considering the diode groups 43, the efficiency of energy conversion may be enhanced by reducing the current to be passed through the one LED chip, and the light-emitting efficiency of the light-emitting module 20*a* as a whole is enhanced.

According to the first embodiment, since the plurality of LED chips 36*a*, 36*b* and 36*c* are sealed by one sealing member 45, variability of the light-emitting properties from one LED chip to another is reduced. In other words, when the one LED chip is sealed by one sealing member, the variability of light-emitting properties from one LED chip to another directly leads to the variability of light-emitting properties of the sealed light-emitting elements. However, by sealing the plurality of LED chips 36*a*, 36*b* and 36*c* by one sealing member 45 together as in the first embodiment, the variability of the light-emitting properties of the respective chips are compensated, and the variability of light emitting properties of the light-emitting module as a whole is reduced.

In the first embodiment described above, the configuration in which the three LED chips 36a, 36b and 36c are sealed by the one sealing member 45 has been described. However, the number of LED chips to be sealed altogether by the sealing member 45 only has to be plural, and the effect as described above is achieved as long as two or more LED chips are provided. In other words, the number of LED chips may be at least two or more, for example, four or more.

In contrast, when the number of the LED chips to be sealed by the one sealing member 45 increases, the required amount of the sealing members increases inevitably, and the surface area of a sealed area also increases. Therefore, it is expected that maintaining the dome shape of the sealing member 45 becomes difficult, and hence the light-emitting property is affected. In other words, when a larger number of the LED chips are sealed in the sealing member 45 having a largest diameter which can maintain the dome shape, the distance between the LED chip and a surface of the sealing member 45 is gradually reduced. In such a case, an optical path length of light emitted from the LED chip and going out from the surface of the sealing member 45 is reduced, and the ratio of blue light which is radiated as-is without being absorbed by the phosphor particles is increased, and hence color variability may occur.

Therefore, in the first embodiment, in order to prevent the above-described color variability, the plurality of LED chips 36a, 36b and 36c are sealed with the sealing member 45 in a closed-up state. In order to measure the density which does not cause the color variability, an adequate range of a mounting area for mounting the LED chips which does not cause the color variability was inspected by changing variously the ratio of the diameter of the mounting area with respect to the diameter of the sealed area sealed by the sealing member 45. Consequently, in the case of the light-emitting module 20a having a layout in which the LED chips are arranged at the apexes of a regular polygon as in the first embodiment, a case in which the diameter of the mounting area for mounting the LED chips is set to ½ or smaller of the diameter of the sealed area sealed by the sealing member 45 was found to be best to obtain a desirable light-emitting property without causing any color variability.

In the first embodiment described above, the layout in which the LED chips 36a, 36b and 36c are arranged at the respective corners of the regular triangle is employed. However, for example, even when the layout in which the LED chips are arranged at respective corners of a square, the fact that the same effect is achieved only by arranging all the LED chips in the mounting area having a diameter of ½ or smaller of the sealed area is known.

When the size of the LED chips may be reduced, and the diameter of the sealed area sealed by the sealing member 45 which can maintain the dome shape can be increased, the plurality of LED chips may be arranged in double or triple ring shapes. In such a case, color difference of light emitted from the respective LED chips depending on the angles may be eliminated, and further desirable light-emitting property is obtained.

Furthermore, by employing the layout in which the plurality of LED chips are arranged in a regular polygonal shape and devising a mounting posture of the respective LED chips themselves, occurrence of the color variability as the diode group 43 can be prevented further reliably. In other words, for example, by arranging all the LED chips in the postures in which longitudinal axes of the respective chips extend along the respective sides of the regular polygon as in the modification exemplified in FIG. 8 or FIG. 9, a layout of point symmetry with respect to the center of the sealing member 45 is achieved, and the distances from light-emitting portions of the respective LED chips to an edge of the sealing member 45 may be substantially equalized, and hence the occurrence of the color variability is substantially eliminated.

Figure 8:
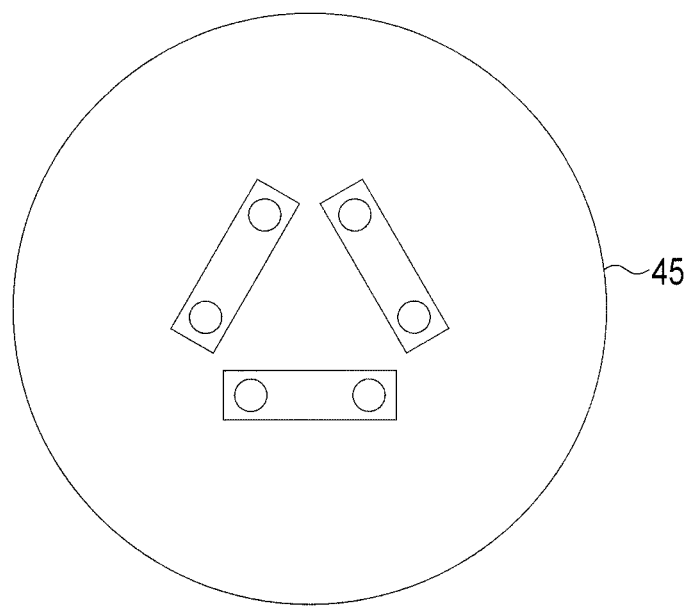
FIG. 8 illustrates a schematic drawing of a first modification in which a posture of LED chips in FIG. 7 is changed.
Figure 9:
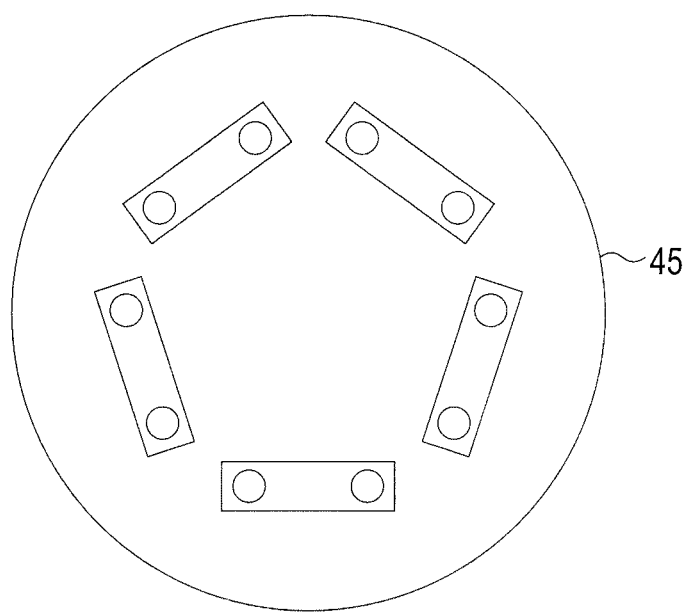
FIG. 9 illustrates a schematic drawing of a second modification.

The shape of the sealing member 45 in the modifications illustrated in FIG. 8 and FIG. 9 is preferably circular in comparison with the oval shape. In this case, although not illustrated, power distribution pads configured to distribute power to the respective LED chips are needed to be provided one for each LED, and are required to be arranged within the sealed area and outside the mounting area for mounting the LED chips. For Example, in the case of the modification in FIG. 9, ten of the power distribution pads need to be prepared for distributing power to the five LED chips respectively, and are arranged in a ring shape on the outside of the mounting area.

In other words, according to the two modifications described above, the respective power distribution pads may be divided into small pieces to reduce the surface area and hence the problem of the dark lighting described above is further reduced.

(Second Embodiment)

FIG. 10 illustrates a plan view of a principal portion of a light-emitting module 50 according to a second embodiment. The light-emitting module 50 according to the second embodiment has the substantially same structure as the light-emitting module 20a according to the first embodiment described above except that the layout of the LED chips 36a, 36b and 36c is changed. Accordingly, the components which function in the same manner as the light-emitting module 20a of the first embodiment are designated by the same reference signs, and the detailed description is omitted.

A diode group 52 of the light-emitting module 50 according to the second embodiment includes a chip layout in which the plurality of (three in the second embodiment) LED chips 36a, 36b and 36c are arranged in a line in proximity to each other. More specifically, the three LED chips 36a, 36b and 36c are closed up in proximity so that the longitudinal axes thereof are arranged in parallel to each other, and the longitudinal axis L1 of the sealing member 45 and the longitudinal axes of the respective LED chips 36a, 36b and 36c are substantially orthogonal to each other.

According to the second embodiment, the same effect as the first embodiment described above is achieved. Furthermore, according to the second embodiment, since the plurality of LED chips are arranged in a line, the layout of the chips is easier and the wire bonding is also easier, and the manufacture of the light-emitting module 50 is easier than the first embodiment described above, and reduction of the manufacturing cost of the light-emitting module 50 is achieved.

In the second embodiment as well, when the optimal diameter of the mounting area for mounting the LED chips which does not cause the color variation was inspected, the desirable light-emitting property without any color variability was found to be obtained when all the LED chips are mounted within a range of a diameter of ⅔ or smaller of the diameter of the sealed area.

To name a detailed example, when the length along the longitudinal axis of the LED chip is 0.6 mm, the width is 0.2 mm and the diameter of the sealing member 45 is 6 mm, the optimal diameter of the mounting area for mounting the LED chips falls within the above-described range by setting the width of the area in which the three LED chips are arranged and mounted side by side to 4 mm or smaller. In other words, in this case, the diameter of the mounting area for mounting the LED chips can be set to ⅔ or smaller of the diameter of the sealed area sealed by the sealing member 45, so that the color variability is prevented.

In the second embodiment, the case where the three LED chips 36a, 36b and 36c are arranged and mounted in a line has been described. However, the number of LED chips may be any suitable plural and two or more, for example, four or more is also applicable. However, if the number of LED chips to be arranged in a line increases, connection of the bonding wires 41 and 42 to be connected to the power distribution pads 29 and 30 becomes difficult and mechanical limitations are inevitable.

Figure 11:
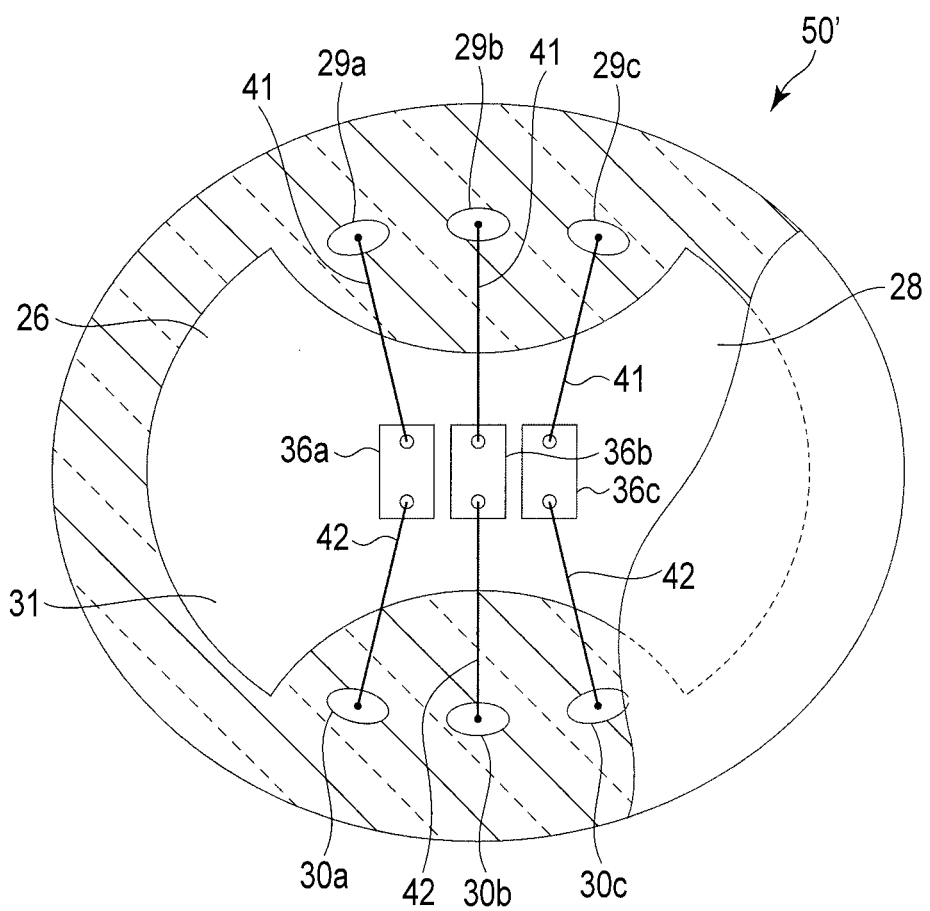
FIG. 11 illustrates a plan view of a modification of the light-emitting module in FIG. 10.

Therefore, as in the modification illustrated in FIG. 11, a method of preparing individual power distribution pads 29a, 29b, 29c, 30a, 30b and 30c for the respective LED chips 36a, 36b and 36c, and connecting the respective LED chips to the power distribution pads individually is contemplated.

By employing the method described above, as illustrated in the drawing, the bonding wires 41 and 42 to be connected to the respective power distribution pads 29a, 29b, 29c, 30a, 30b and 30c may be extended in the widening direction toward the pads, whereby the bonding with respect to the pads may be performed easily. When the method described above is employed, the power distribution pads may be divided into a plurality of smaller parts, and the problem of the dark lighting described above may be eliminated.

In such a case, in comparison with the second embodiment described above, since the number of bonding wires 41 and 42 to be connected may be increased easily, the flexibility of chip layout is enhanced, and the number of LED chips to be mounted may be increased easily. Also, in contrast, the plurality of LED chips may be mounted in a closed-up manner without considering the mechanical limitations of the wire bonding and hence the chips can easily be concentrated to a center of the sealed area.

However, in the second embodiment, if the number of LED chips is increased, the shape of the sealing member 45 is changed from the circular shape to the elongated oval shape, and the range of the optimal mounting area can hardly be specified with the comparison with the diameters as described above. Therefore, in the case of the second embodiment, the color variability is eliminated by setting a proper distance between the respective LED chips and the surface of the sealing member 45 instead of specifying the range of the mounting area.

FIG. 12A and FIG. 12B illustrate an optimal shape of the sealing member 45 when the three LED chips 36a, 36b and 36c are arranged in a line. In other words, as illustrated in a plan view in FIG. 12A, the shape of a peripheral edge 45a of the optimal sealing member 45 is an oval shape, and the distances D from the respective LED chips 36a, 36b and 36c to the peripheral edge 45a are all the same. As illustrated in a cross-sectional view in FIG. 12B, distances D from the upper surface of the respective LED chips 36a, 36b and 36c in the drawing to a top portion 45b of the sealing member 45 are also the same.

In other words, light emitted from the respective LED chips 36a, 36b and 36c is absorbed by the phosphor particles of the sealing member 45, and emits yellow light. However, the amount of the yellow light is determined according to the optical path length of light emitted from the respective LED chips 36a, 36b and 36c and passing through the surface of the sealing member 45. The amount of blue light transmitted is also determined according to the optical path length. In other words, by equalizing all the distances D from the respective LED chips 36a, 36b and 36c to the surface of the sealing member 45, the color variability is also prevented.

According to the light-emitting module and the luminaire of at least one of embodiment described above, since the plurality of LED chips are sealed by the sealing member in a closed-up manner, the light-emitting surface area may be increased, and the sufficiently satisfactory luminous flux may be obtained, and the energy efficiency may be enhanced.

For example, in the embodiments described above, a base light which is to be surface mounted to the ceiling has been described as the luminaire. However, the luminaire is not limited thereto, and may also be implemented in luminaires of other forms such as street lights or guide lights.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light-emitting module comprising:
an elongated substrate comprising a plurality of installation regions spaced from one another;
a group of light-emitting elements arranged in each of the installation regions in a concentrated manner and having similar characteristics; and
a sealing member having a dome shape independently provided for each of the installation regions, configured to contain a fluorescent substance and seal the installation regions and the light-emitting elements provided in the installation regions.

2. The light-emitting module according to claim 1, wherein the group of light-emitting elements sealed by the sealing member is arranged in a line in proximity to each other.

3. The light-emitting module according to claim 2, wherein the group of light-emitting elements arranged in a line is arranged within a mounting area having a diameter of ⅔ or smaller of the diameter of a sealed area of the sealing member.

4. The light-emitting module according to claim 2, wherein the group of light-emitting elements arranged in a line are sealed by the sealing member having an oval shape or an ellipse shape having a longitudinal axis along a direction of arrangement thereof.

5. The light-emitting module according to claim 1, wherein the group of light-emitting elements sealed by the sealing member is arranged in a ring shape.

6. The light-emitting module according to claim 5, wherein the group of light-emitting elements arranged in the ring shape is arranged within a mounting area having a diameter of ½ or smaller of the diameter of a sealed area of the sealing member.

7. The light-emitting module according to claim 1, further comprising:
a light reflecting layer provided on a mounting surface of the substrate; and
a power distribution pad provided on the mounting surface separately from the light reflecting layer and having a surface area smaller than that of the light reflecting layer.

8. The light-emitting module according to claim 7, wherein bonding wires configured to connect the respective light-emitting elements and the power distribution pad converge on the power distribution pad.

9. The light-emitting module according to claim 7, wherein
the power distribution pad is divided into a plurality of portions configured to distribute power to the group of light-emitting elements sealed by the sealing member respectively and individually, and the bonding wires connecting the respective light-emitting elements and the plurality of portions of the power distribution pad spread to the plurality of portions.

10. A luminaire comprising:

a main body comprising a supporting surface;

a light-emitting module mounted so as to come into contact with the supporting surface; and a lighting circuit configured to light the light-emitting module;

the light-emitting module comprising:

an elongated substrate comprising a plurality of installation regions spaced from one another;

a group of light-emitting elements arranged in each of the installation regions in a concentrated manner and having similar characteristics and coming into contact with the supporting surface; and a sealing member having a dome shape independently provided for each of the installation regions, configured to contain a fluorescent substance and seal the installation regions and the light-emitting elements provided in the installation regions.

11. The luminaire according to claim 10, wherein the group of light-emitting elements sealed by the sealing member is arranged in a line in proximity to each other.

12. The luminaire according to claim 11, wherein the group of light-emitting elements arranged in a line is arranged within a mounting area having a diameter of ⅔ or smaller of the diameter of a sealed area of the sealing member.

13. The luminaire according to claim 11, wherein the group of light-emitting elements arranged in a line are sealed by the sealing member having an oval shape or an ellipse shape having a longitudinal axis along a direction of arrangement thereof.

14. The luminaire according to claim 10, wherein the group of light-emitting elements sealed by the sealing member is arranged in a ring shape.

15. The luminaire according to claim 14, wherein the group of light-emitting elements arranged in the ring shape is arranged within a mounting area having a diameter of ½ or smaller of the diameter of a sealed area of the sealing member.

16. The luminaire according to claim 10, further comprising:

a light reflecting layer provided on a mounting surface of the substrate; and a power distribution pad provided on the mounting surface separately from the light reflecting layer and having a surface area smaller than that of the light reflecting layer.

17. The luminaire according to claim 16, wherein bonding wires configured to connect the respective light-emitting elements and the power distribution pad converge on the power distribution pad.

18. The luminaire according to claim 16, wherein the power distribution pad is divided into a plurality of portions configured to distribute power to the group of light-emitting elements sealed by the sealing member respectively and individually, and the bonding wires connecting the respective light-emitting elements and the plurality of portions of the power distribution pad spread to the plurality of portions.

* * * * *